Feb. 8, 1966 J. C. MARINACE 3,234,058

METHOD OF FORMING AN INTEGRAL MASKING FIXTURE BY EPITAXIAL GROWTH

Filed June 27, 1962

INVENTOR
JOHN C. MARINACE

BY John F. Okland Jr.
ATTORNEY

United States Patent Office 3,234,058
Patented Feb. 8, 1966

3,234,058

METHOD OF FORMING AN INTEGRAL MASKING FIXTURE BY EPITAXIAL GROWTH

John C. Marinace, Yorktown Heights, N.Y., assignor to International Business Machines Corporation, New York, N.Y., a corporation of New York Filed June 27, 1962, Ser. No. 205,725
9 Claims. (Cl. 148—175)

This invention relates to semiconductor devices and, in particular, to an improved method of fabricating particular types of semiconductor devices, especially those known as tunnel diodes.

In the fabrication of tunnel diode devices it has been found important to be able to create a junction of extremely small area so as to allow for the possibility of obtaining extremely small peak currents in such devices. However, using ordinary techniques as they have developed heretofore in the semiconductor art, it has turned out that extreme difficulties are encountered in reconciling the small junction area requirement with the requirement that the final structure be mechanically strong. Present widely-used alloy methods of making tunnel diodes require an etching step for surface clean up and junction area or peak current control which results in a very narrow, mechanically unstable, pedestal of semiconductor material supported between the alloy dot and the crystal wafer.

Also, a further difficulty presents itself in that surface leakage effects are not negligible where tolerances on the order of a few percent are imposed as, for example, in the fabrication of tunnel diodes which are to be used in computer circuits.

As a means of providing mechanically strong tunnel diode units, epitaxially grown heterocrystal structures have been created heretofore, that is, integral crystalline structures have been formed which involve the union of several different semiconductor materials, which materials are selected to have crystalline compatibility. These epitaxial grown heterojunction crystal structures have lent themselves to the formation of very small area junctions with the provision of adequate support for the junctions. However, there still remains the problem of surface leakage effects which must be reduced to a minimum. It is, therefore, of extreme importance to minimize the amount of junction area that remains exposed at a surface of the semiconductor crystal wherein the junction device is formed.

Although in the description of the present invention reference will be made hereafter to tunnel diode junctions, the concept of the present invention is also applicable to other junctions in diodes and transistors.

Accordingly it is a primary object of the present invention to enable the fabrication of junctions of extremely small dimensions, which junctions are protected from surface leakage effects.

It is another object to permit the reproducible fabrication of large numbers of junction devices of extremely small dimensions.

A further object is to obtain devices whose junctions are protected from surface leakage effects and which concommitantly have low capacitance values.

Yet another object is to fabricate simultaneously an array of junction devices, having the aforesaid physical and electrical characteristics, utilizing a vapor growth technique.

The foregoing and other objects, features and advantages of the invention will be apparent from the following more particular description of a preferred embodiment of the invention, as illustrated in the accompanying drawings.

Figure 1:
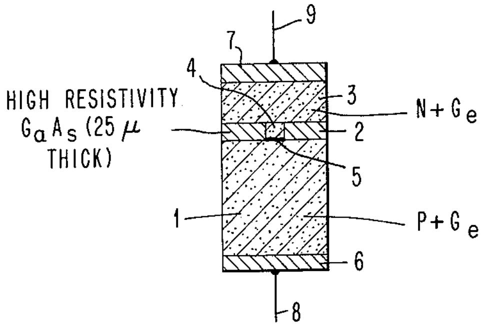
FIG. 1 is a side view in section of a completed semiconductor device in accordance with the present invention.
Figure 1A:
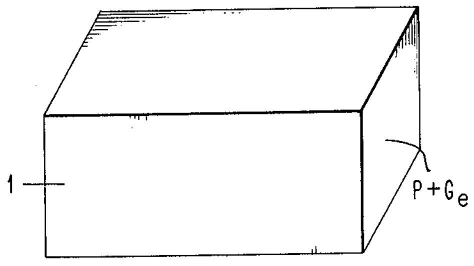
FIGS. 1A through 1E are various views of the semiconductor structure at different stages in the fabrication which results in the device as depicted in FIG. 1.

Referring now to the figures wherein the same numerals denote the same basic parts: In FIG. 1 a completed device is shown made up of a substrate region 1, typically constituted of P+ germanium where the device being fabricated is a tunnel diode. A thin layer 2 of high resistivity gallium arsenide, having a thickness on the order of 25 microns, is shown situated on the top surface of the substrate 1. The layer 2 has such high resistivity as to be capable of acting as an insulator. It is to be noted that the layer 2 may be of such thickness as to permit the attainment of extremely low capacitance for the finally fabricated devices. A layer 3 of N+ germanium, which like the previous region 1 is degenerately doped, on the order of $10^{19}$ atoms/cc., is disposed on top of the layer 2. The N+ germanium material is also situated in the hole 4 in the high resistivity gallium arsenide layer 2, thereby forming a junction 5 with the P+ germanium. This junction is a quantum mechanical tunneling junction, due to the extermely high doping levels, yielding the special characteristics, notably the negative resistance, peculiar to this type of construction. For further details, reference may be had to a letter to the editor in the Physical Review, January 1958, by Leo Esaki, pp. 603–604. Metal contacts 6 and 7 are made to the respective bottom and top surfaces of the structure of FIG. 1, and these contacts ar ohmic in character. In accordance with standard practice, electrical leads 8 and 9 are attached, typically by soldering to the respective ohmic contacts 6 and 7.

Figure 1B:
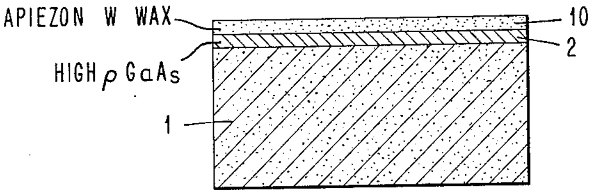

Referring now to FIGS. 1A through 1E, the various steps according to the present invention are illustrated. um is shown. In FIG. 1B, the several layers formed on In FIG. 1A, the semiconductor substrate 1 of germani- the top surface of the substrate are indicated. The initial layer that is formed is of high resisitivity gallium arsenide. This layer is preferably formed by a vapor growth technique wherein a source of gallium arsenide material that is to be deposited is reacted with a halogen transport element, such as iodine, in one portion of a reaction container and a substrate, which is positioned in a lower temperature zone of the reaction container has deposited on it, due to the disproportionation reaction involved in the technique, a thin layer which builds up slowly on the top surface of the substrate. For details of the technique whereby galium arsenide material may be vapor grown in this manner, reference may be had to application Serial No. 59,004 assigned to the assignee of this application.

After formation of the layer 2 of gallium arsenide to a depth of approximately 25 microns, a thin layer 10 of a suitable resist material such as apiezon W wax is placed on the top of layer 2. The purpose of the wax is to facilitate formation of extremely small apertures into the gallium arsenide layer 2. The apiezon W wax layer has a thickness on the order of 25–75 microns. The etch resist properties of the material deposited on top of the layer 2 is quite important. The other important properties are easy applicability and adherence, low dielectric strength, easy vaporizability, high viscosity at room temperatures and solubility in ordinary solvents.

After the layer of apiezon W wax is applied, preferably by spraying a solution of the wax in a solvent such as trichloroethelyne to give nearly uniform thickness, it is allowed to dry and cure. This requires about 1 hour at room temperature. Next, the assembly is held rigid, for example in a metal vise, and the substrate 1 is effectively grounded as shown in FIG. 1C.

Figure 1C:
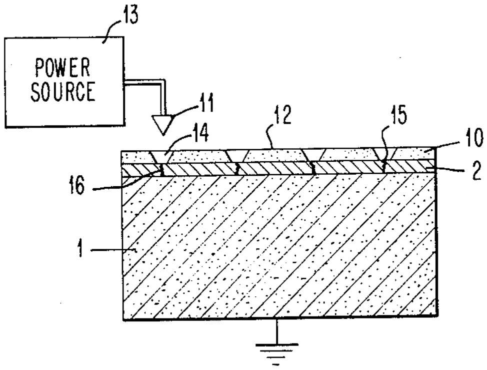

In FIG. 1C, a micromanipulator having a sharp pointed spring wire probe 11 is positioned above the waxed surface. Where a hole is desired, the probe is first brought down normal to the surface 12 and is first pressed into the etch resist 10 (apiezon W wax) without the application of any electrical power. The probe may actually reach the semiconductor surface, that is, the high resistivity gallium arsenide layer, without seriously affecting the results. The probe is then withdrawn until it is approximately 25–50 microns above the depression initially formed in the etch resist. Then, a high voltage pulse from the power source 13 is discharged from the probe to the grounded semiconductor. The arc formed vaporizes the etch resist in the depression. Likewise, the gallium arsenide layer breaks down since the occurrence of the arc signifies that the gallium arsenide has experienced a dielectric break down at the point at which the wax had been vaporized. This dielectric break down is indicated in FIG. 1C by the numeral 16.

The breaking down of the gallium arsenide layer aids subsequent etching. This subsequent etching step is performed at the bottom of the pit 14 formed in the layer 2. The amount of etch resist that is vaporized seems to depend on the energy of the arc formed. A typical example discharges a 120$\mu$f. condenser at 80 volts through the input of a Tesla coil; the output of the Tesla coil is connected to the probe 11. These values produce holes of approximately 25 microns or slightly less in a layer of apiezon W wax approximately 50 microns thick, and also cause a dielectric break down of the GaAs where the apiezon W wax has been blown away.

The purpose of forming an initial depression in the etch resist layer 10 is to insure that dielectric break down will occur exactly at that point. If the depression is not made first, the arc occurs at the weakest nearby dielectric point or even to a previously formed pit. Another reason for the formation of the depression is to funnel the arc into the small area desired. The probe 11 is then removed to another point, and, as illustrated in FIG. 1C, the process is repeated to produce a plurality of holes. Arrays of 100 or more holes have been made in layers of gallium arsenide, approximately 25 microns thick, deposited on germanium substrates.

Figure 1E:
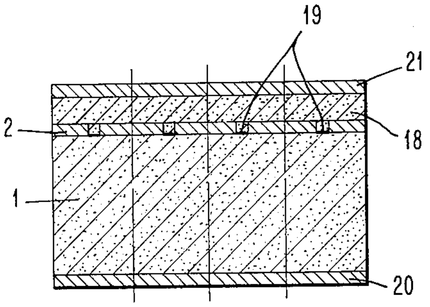
Figure 1D:
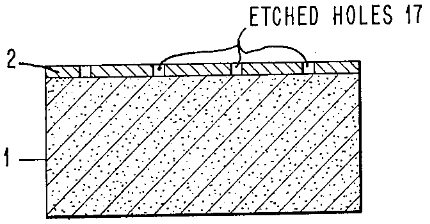

With the very tiny areas 15 of the high resistivity gallium arsenide that is exposed at the bottom of the pits 14, an etchant is now used to etch into the gallium arsenide layer thereby forming the etched holes 17 as indicated in FIG. 1D. An etchant that has been used consists of 5 parts $NHO_3$, 1 part HF and 10 parts $H_2O$. Another etchant, whose virtue lies in its ability to etch GaAs slowly but at a rate 1000 $\times$ that at which it etches Ge, has also been used successfully.

As illustrated in FIG. 1E, after removal of the etch resist material, that is, the apiezon W wax from the top surface, the opposite conductivity germanium material 18, in this example N+Ge, is vapor grown onto the top surface and into the previously-etched holes 17, thereby to create an array of tunnel diode devices with the junctions 19 defined by the contact of the P+ and N+ germanium. Of course, if desired, heterojunction devices can be realized by depositing gallium arsenide or some other epitaxially compatible semiconductor onto the top surface and into the holes. Thereafter, ohmic contacts 20 and 21 are formed on the top and bottom surfaces of the structure.

The group of devices may be left in array form as illustrated in FIG. 1E, or individual units may be cut away from the array, a typical one of which has been shown in FIG. 1.

What has been disclosed is a novel technique for providing very small area junction devices whereby the junctions are protected from surface leakage effects by reason of being encapsulated within a high resistivity semiconductive layer. The devices thus obtained have very low values of capacitance due to the ability to deposit the epitaxially compatible, high resistivity, semiconductor material to reasonable thicknesses.

Although reference herein has been chiefly to the fabrication of tunnel diode devices, it will be apparent to the man skilled in the art that the technique of the present invention may also be applied to other junctions in diodes and transistors. As a specific example, a parametric diode device can also be obtained with a modification of the basic technique previously described. In this case, rather than employing a degenerately doped substrate, a moderately doped substrate of one conductivity-type is used and a small hole is formed in the deposited high resistivity layer, as heretofore described. A short diffusion step is now used, that is, an impurity of the same conductivity-type is diffused in to the previously-formed hole so as to create a retrograded impurity distribution in the substrate immediately adjacent the junction that is to be formed. Thereafter, degenerately doped material of opposite conductivity-type is deposited into the hole so as to define the required variable capacitance junction.

While the invention has been particularly shown and described with reference to a preferred embodiment thereof, it will be understood by those skilled in the art that various changes in form and details may be made therein without departing from the spirit and scope of the invention.

What is claimed is:

1. The process of fabricating a semiconductor device comprising the steps of:

providing a substrate of semiconductor material of one conductivity type, epitaxially forming a layer of semiconductor material of such high resistivity as to act as an insulator on one surface of said substrate, forming at least one hole in the high resistivity layer, and epitaxially depositing semiconductor material of opposite conductivity type over said high resistivity layer and into said at least one hole to define a junction between said substrate and said material of opposite conductivity type.

2. A process as defined in claim 1 wherein said substrate material is germanium, said high resistivity layer is gallium arsenide and said deposited material is germanium.

3. A process of fabricating a semiconductor device comprising the steps of:

providing a substrate of semiconductor material of one conductivity-type, degenerately doped to a level of approximately $10^{19}$ atoms/cc.;

epitaxially forming a layer of semiconductor material such high resistivity as to act as an insulator on one surface of said substrate;

forming at least one hole in the high resistivity layer;

epitaxially depositing semiconductor material of opposite conductivity-type, likewise doped to a level about $10^{19}$ atoms/cc. over said high resistivity layer and into said at least one hole, to define a tunnel diode junction with the material of said substrate.

4. A process as defined in claim 3 wherein said substrate material is germanium, said high resistivity layer is gallium arsenide and said deposited layer is germanium.

5. A process of fabricating a semiconductor device comprising the steps of:

providing a substrate of semiconductor material of one conductivity type;

epitaxially forming a layer of semiconductor material of such high resistivity as to act as an insulator on one surface of said substrate;

depositing a layer of etch-resistant material on the surface of said previously-grown, high resistivity layer;

discharging a high voltage source through a probe positioned above said etch-resistant layer so as to vaporize a small pit in said layer and to expose a small area of said previously-grown, high resistivity layer;

etching into the pit previously formed so as to produce a very small area hole in said high resistivity layer; and epitaxially depositing semiconductor material of opposite conductivity-type over said high resistivity layer and into said at least one hole.

6. A process as defined in claim 5 further comprising the steps of:

removing the etch-resistant material on the surface of said previously-formed, high resistivity layer; and forming an ohmic contact to another surface of said substrate and to the surface of said epitaxially deposited material of opposite conductivity-type.

7. A process of fabricating a semiconductor device comprising the steps of:

providing a substrate of semiconductor material of one conductivity-type degenerately doped to a level of approximately $10^{19}$ atoms/cc.;

epitaxially forming a layer of semiconductor material of high resistivity, about $10^6$ ohm/cm.;

forming a layer of etch-resistant material on the surface of said previously-formed, high resistivity layer;

discharging a high voltage source through a probe positioned above said etch-resistant layer so as to vaporize a small pit in said layer and to expose a small area of said previously formed, high resistivity layer;

etching into the pit previously formed, thereby to produce a very small area hole in said high resistivity layer;

epitaxially depositing semiconductor material of opposite conductivity-type, likewise doped to a level about $10^{19}$ atoms/cc. over said high resistivity layer and into said at least one hole to define a tunnel diode junction with the material of said substrate.

8. A process as defined in claim 7 further comprising the steps of:

removing the etch-resistant material on the surface of said previously formed, high resistivity layer; and forming an ohmic contact to another surface of said substrate and to the surface of said epitaxially deposited material of opposite conductivity-type.

9. The process as defined in claim 8 further comprising the step of:

attaching electrical leads to the respective ohmic contacts.

References Cited by the Examiner

UNITED STATES PATENTS

| | | | |
|---|---|---|---|
| 2,332,003 | 10/1943 | New | 156—12 |
| 2,492,214 | 12/1949 | Fonda | 204—143 |
| 2,983,655 | 5/1961 | Sullivan | 204—143 |
| 3,041,225 | 6/1962 | Emeis | 204—134 |
| 3,044,909 | 7/1962 | Shockley | 148—187 |
| 3,047,438 | 7/1962 | Marinace | 148—175 |

FOREIGN PATENTS

| | | |
|---|---|---|
| 864,705 | 4/1961 | Great Britain. |

OTHER REFERENCES

IBM Technical Disclosure, vol. 4, No. 3, July 1960, pp. 283–287.

Lazerenko et al.: Stanki I Instrument, vol. 17, 1946 (Brutcher translation No. 2547), relied on p. 7 of translation.

DAVID L. RECK, *Primary Examiner.*